(12) United States Patent
Akram

(10) Patent No.: US 6,330,158 B1
(45) Date of Patent: *Dec. 11, 2001

(54) SEMICONDUCTOR PACKAGE HAVING HEAT SINKS AND METHOD OF FABRICATION

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 9 days.

This patent is subject to a terminal disclaimer.

(21) Appl. No.: 09/587,610

(22) Filed: Jun. 5, 2000

Related U.S. Application Data

(63) Continuation of application No. 09/093,295, filed on Jun. 8, 1998, now Pat. No. 6,075,288.

(51) Int. Cl.[7] ....................................... H05K 7/20
(52) U.S. Cl. ..................... 361/704; 361/702; 361/719; 257/706; 165/80.3
(58) Field of Search ................................. 361/700–712, 361/714–719; 257/706–727, 692–693, 686, 685, 797, 666; 174/15.1, 15.2, 16.3, 200, 201, 52.4; 165/80.2, 80.3, 80.4, 185; 29/832, 837

(56) References Cited

U.S. PATENT DOCUMENTS

| | | |
|---|---|---|
| 3,831,067 | 8/1974 | Wislocky et al. . |
| 4,000,509 | 12/1976 | Jarvela . |
| 4,945,398 | 7/1990 | Kurita et al. . |
| 5,067,005 | 11/1991 | Michii et al. . |
| 5,073,521 | 12/1991 | Braden . |
| 5,155,661 | 10/1992 | Nagesh et al. . |
| 5,177,669 | 1/1993 | Juskey et al. . |
| 5,191,511 | 3/1993 | Sawaya . |
| 5,239,198 | 8/1993 | Lin et al. . |
| 5,365,107 | 11/1994 | Kuraishi et al. . |
| 5,410,451 | 4/1995 | Hawthorne et al. . |
| 5,474,957 | 12/1995 | Urushima . |
| 5,550,711 | 8/1996 | Burns et al. . |
| 5,566,051 | 10/1996 | Burns . |
| 5,578,869 | 11/1996 | Hoffman et al. . |
| 5,581,121 | 12/1996 | Burns et al. . |
| 5,585,668 | 12/1996 | Burns . |
| 5,594,282 | 1/1997 | Otsuki . |
| 5,615,475 | 4/1997 | Burns . |
| 5,629,561 | 5/1997 | Shin et al. . |
| 5,663,872 | 9/1997 | Gainey . |
| 5,666,003 | 9/1997 | Shibata et al. . |
| 5,672,548 | 9/1997 | Culmane et al. . |
| 5,751,061 | 5/1998 | Mays et al. . |
| 5,790,378 | 8/1998 | Chillara . |
| 5,801,437 | 9/1998 | Burns . |
| 5,834,850 | 11/1998 | Hotta et al. . |
| 5,864,175 | 1/1999 | Burns . |
| 6,049,125 | 4/2000 | Brooks et al. . |
| 6,075,288 | * 6/2000 | Akram .................................. 257/706 |

* cited by examiner

Primary Examiner—Leo P. Picard
Assistant Examiner—Michael Datskovsky
(74) Attorney, Agent, or Firm—Stephen A. Gratton

(57) ABSTRACT

A semiconductor package includes a semiconductor die, a lead frame wire bonded to the die, and a plastic body encapsulating the die. The package also includes a first heat sink attached to a face of the die, and a second heat sink attached to a back side of the die. Thermally conductive adhesive layers attach the heat sinks to the die, and provide a thermal path therebetween. In addition, the heat sinks project from the plastic body, and have end portions that are sized and shaped to interlock with heat sinks on an adjacent package to form an electronic assembly. In the electronic assembly, the interlocking heat sinks maintain contact surfaces on the heat sinks in physical contact and improve heat dissipation from the packages. An alternate embodiment package includes a thermally conductive encapsulant which attaches a pair of heat sinks, and encapsulates the die.

43 Claims, 4 Drawing Sheets

PROVIDING A SEMICONDUCTOR DIE 12

PROVIDING A LEAD FRAME 14 HAVING LEAD FINGERS 28

ATTACHING THE DIE 12 TO THE LEAD FRAME 14

WIRE BONDING THE DIE 12 TO THE LEAD FRAME 14

ATTACHING HEAT SINKS 16, 18 TO THE DIE 12 USING A THERMALLY CONDUCTIVE ADHESIVE LAYER 36

MOLDING PLASTIC BODY 20 TO LEADFRAME 14 TO ENCAPSULATE DIE 12 LEAVING END PORTIONS E-16, E-18 OF HEAT SINKS 16, 18 EXPOSED

TRIMMING LEAD FRAME 14 AND FORMING TERMINAL LEADS 34

(OPTIONALLY FOR FABRICATING AN ELECTRONIC ASSEMBLY) ATTACHING PACKAGES 10 TO A SUBSTRATE 44 WITH CONTACT SURFACES ON CS-18, CS-16 ON HEAT SINKS 16, 18 OF ADJACENT PACKAGES 10 IN PHYSICAL CONTACT AND THERMAL COMMUNICATION

FIGURE 7

SEMICONDUCTOR PACKAGE HAVING HEAT SINKS AND METHOD OF FABRICATION

CROSS REFERENCE TO RELATED APPLICATIONS

This application is a continuation of application Ser. No. 09/093,295 filed on Jun. 8, 1998, U.S. Pat. No. 6,075,288.

FIELD OF THE INVENTION

This invention relates generally to semiconductor packaging, and specifically to an improved semiconductor package having interlocking heat sinks. This invention also relates to a method for fabricating the package, and to an electronic assembly fabricated using multiple interlocked packages.

BACKGROUND OF THE INVENTION

A conventional plastic semiconductor package includes a semiconductor die wire bonded to a lead frame, and encapsulated in a plastic body. One consideration in designing a plastic package is heat transfer from the die. Operation of the integrated circuits within the die generate heat which must be dissipated. In a conventional plastic semiconductor package, the bulk of heat transfer from the encapsulated die is through the terminal leads of the package. However, as circuit densities increase, semiconductor dice generate additional heat, and the leads of the package are not always able to efficiently dissipate the heat.

This has led to the development of semiconductor packages that include a heat sink. Typically, the heat sink comprises a metal plate embedded in the plastic body of the package. Representative heat sink packages are described in U.S. Pat. No. 5,666,003 entitled "Packaged Semiconductor Device Incorporating Heat Sink Plate", and in U.S. Pat. No. 5,629,561 entitled "Semiconductor Package With Integral Heat Dissipator".

One consideration in packages that incorporate a heat sink is the thermal path from the die to heat sink. In some designs the thermal path may depend on direct contact of the die with the heat sink. However, the contact areas between the die and the heat sink may have a relatively small surface area. In other designs, the heat sink may not have direct contact with the die, but rather is in contact with the lead frame. The thermal path from the die to the heat sink is thus through the lead frame. This thermal path may not be as efficient as is desirable for dissipating as much heat as possible from the die.

Another consideration in packages that incorporate a heat sink is heat transfer from the heat sink to the environment. In most electronic assemblies that incorporate heat sink semiconductor packages, heat transfer to the environment is by convection to the air. Alternately, a liquid coolant can be used to transfer heat from the individual packages or from the assembly as a whole.

It would be advantageous for a heat sink to provide efficient heat transfer not only from the die, but also from the die to the environment. The present invention is directed to a semiconductor package that includes multiple heat sink elements having efficient heat transfer paths to the die, and to the environment. In addition, the semiconductor package is constructed such that the heat sinks on adjacent packages of an electronic assembly can be interlocked to maintain physical and thermal contact therebetween.

SUMMARY OF THE INVENTION

In accordance with the present invention, an improved semiconductor package, a method for fabricating the package, and an electronic assembly fabricated using multiple packages, are provided. The package includes a semiconductor die, a lead frame and a plastic body. The lead frame forms internal signal traces, and terminal leads for the package.

The package also includes a first heat sink attached to a face of the die, and a second heat sink attached to a backside of the die. A thermally conductive adhesive directly attaches the heat sinks to the die, and provides thermal paths therebetween. The heat sinks project from opposing surfaces of the package body, and include end portions having contact surfaces configured for physical contact with contact surfaces on heat sinks of adjacent packages. In addition, the end portions of the heat sinks can comprise complimentary elements of an interlocking structure. In the electronic assembly, the contact surfaces on mating heat sinks provide a thermal path between adjacent packages, and an improved thermal path from the heat sinks to the environment. The interlocking structure of the heat sinks maintains the contact surfaces in physical contact.

An alternate embodiment semiconductor package includes a first heat sink bonded to the face of the die, and a second heat sink bonded to the backside of the die. In addition, a thermally conductive adhesive encapsulates the die, and forms a thermal path between the die and the heat sinks.

The method for fabricating the semiconductor package includes the steps of attaching the die to the lead frame, and wire bonding bond pads on the die to lead fingers on the lead frame. The heat sinks are then attached to the die using a thermally conductive adhesive. In order to facilitate attachment of the heat sinks to the die, and heat transfer from the die to the heat sinks, the heat sinks can be shaped to contact the edges, face and backside of the die. Following attachment of the heat sinks, the plastic body can be molded around the die and heat sinks.

For fabricating the electronic assembly, a substrate such as a printed circuit board, or ceramic module substrate can be provided. The external leads for the packages can then be bonded to the substrate. In addition, the external portions of the heat sinks can be interlocked to facilitate heat dissipation from the packages, and provide thermal paths between adjacent packages on the substrate.

BRIEF DESCRIPTION OF THE DRAWINGS

FIG. 7 is a block diagram illustrating steps in a method for fabricating the package of FIGS. 1A–1D.

DETAILED DESCRIPTION OF THE PREFERRED EMBODIMENTS

Figure 1A:
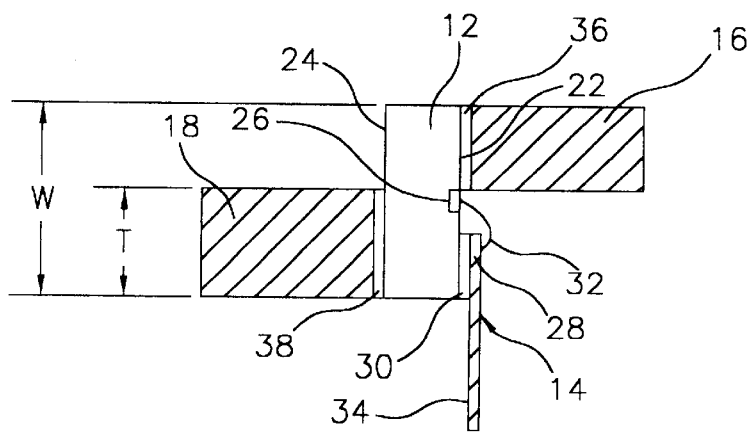
FIG. 1A is an enlarged schematic cross sectional view of a semiconductor package constructed in accordance with the invention with a body of the package removed.
Figure 1B:
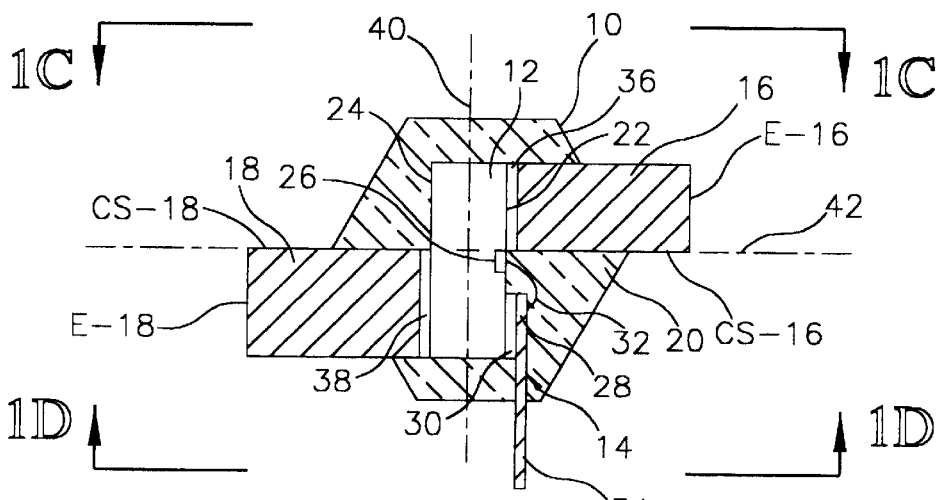
FIG. 1B is an enlarged schematic cross sectional view of the package.

Referring to FIGS. 1A and 1B, a semiconductor package 10 (FIG. 1B) constructed in accordance with the invention is illustrated. The package 10, broadly stated, comprises: a semiconductor die 12; a lead frame 14 attached to the die 12; a first heat sink 16 attached to a face 22 (first side) of the die 12; a second heat sink 18 attached to a back side 24 (second side) of the die 12; and a plastic body 20. In FIG. 1A, the package 10 is illustrated prior to formation of the body 20.

In the illustrative embodiment, the semiconductor die 12 and the lead frame 14 have a leads on chip configuration. In addition, a pattern of bond pads 26 is formed on the face 22 of the die 12 in electrical communication with integrated circuits contained on the die 12.

The lead frame 14 includes lead fingers 28 which are attached to the face 22 of the die 12 using an adhesive layer 30. The adhesive layer 30 can be a conventional die attach adhesive, such as an epoxy, acrylic, silicone or polyimide material. Alternately, the adhesive layer 30 can be a polymer tape, such as "KAPTON" tape manufactured by DuPont.

Wires 32 are wire bonded to the bond pads 26 on the die 12 and to the tip portions of the lead fingers 28. In addition, the tip portions of the lead fingers 28 form the internal signal traces for the package 10. The terminal portions of the lead fingers 28 form terminal leads 34 for the package 10.

Conventional die attach and wire bonding processes can be used to attach and wire bond the die 12 to the lead frame 14. To facilitate these processes, the lead frame 14 can be a strip configured to package several dice at the same time. Following a transfer molding process for forming the plastic bodies 20, the lead frame 14 can be cut or sheared into several individual packages 10. Preferably, the heat sinks 16, 18 are attached to the die 12 following the wire bonding process, but prior to the transfer molding process.

Figures 1C, 1D:
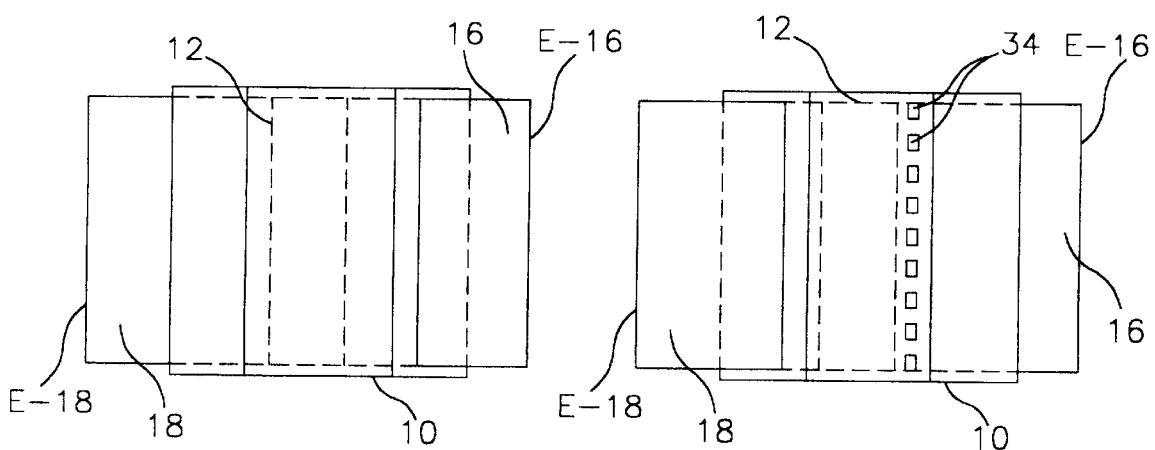
FIG. 1C is a plan view of the package taken along section line 1C—1C of FIG. 1B.
FIG. 1D is a bottom view of the package taken along section line 1D—1D of FIG. 1B.

As shown in FIGS. 1C and 1D, each heat sink 16, 18 is a plate having a generally rectangular, or square, peripheral configuration. In addition, the heat sinks 16, 18 can be formed of a metal having a high thermal conductivity. Preferred metals include copper, aluminum, molybdenum, titanium and alloys of these materials. The heat sinks 16, 18 can also be formed as a composite material, such as copper clad molybdenum, or copper clad "INVAR" (where "INVAR" is an iron-nickel alloy). In general, these composite materials have a low coefficient of thermal expansion (CTE) that is similar to a CTE for silicon.

As shown in FIG. 1A, a thermally conductive adhesive layer 36 can be used to attach the heat sink 16 to the face 22 of the die. Similarly, a thermally conductive adhesive layer 38 can be used to attach the heat sink 18 to the back side 24 of the die 12. The thermally conductive adhesive layers 36, 38 provide a direct thermal path from the die 12 to the heat sinks 16, 18. Suitable materials for forming the thermally conductive adhesive layers 36, 38 include silver filled epoxy, polyimide pastes or pastes filled with boron nitride (BN). Commercial products are available from Ablestik, Epotek and Amicon. Alternately, the thermally conductive adhesive layers 36, 38 can comprise a solder material, such as eutectic AuSi, AuSn or AuGe. Still further, the thermally conductive adhesive layers 36, 38 can comprise a glass adhesive, such as a silver filled glass material.

As shown in FIG. 1B, the plastic body 20 encapsulates the die 12, the lead frame 14 and the heat sinks 16, 18. The plastic body 20 can be formed using a conventional molding process. In addition, a conventional material such as an epoxy novolac resin, a silicone, a phenylsilane or a thermoset plastic, can be used to form the plastic body 20.

In the illustrative embodiment the plastic body 20 has a hexagonal cross sectional configuration (i.e., six sided). However, other polygonal cross sectional configurations for the body 20 can also be used. As also shown in FIG. 1B, the package 10 has a first axis 40 and an orthogonal second axis 42. The die 12 is oriented with the face 22 and backside 24 of the die 12 generally parallel to the first axis 40 and generally perpendicular to the second axis 42.

As shown in FIG. 1D, the terminal leads 34 for the package 10 are located on one side of the die 12 in a single in line configuration. In addition, the terminal leads 34 are oriented along a plane that is generally parallel to the first axis 40 and generally perpendicular to the second axis 42 of the package 10.

The heat sinks 16, 18 are generally orthogonal to the face 22 and backside 24 of the die 12, and generally parallel to the axis 42 of the package 10. In addition, the heat sinks 16, 18 have end portions E-16, E-18 that project from the surfaces of the plastic body 20. The end portions E-16, E-18 include planar contact surfaces CS-16, CS-18 configured for physical contact with mating contact surfaces on an adjacent package substantially identical to package 10. The contact surfaces CS-16, CS-18 can be co-planar, or alternately parallel, to the second axis 42 of the package 10.

Figure 2:
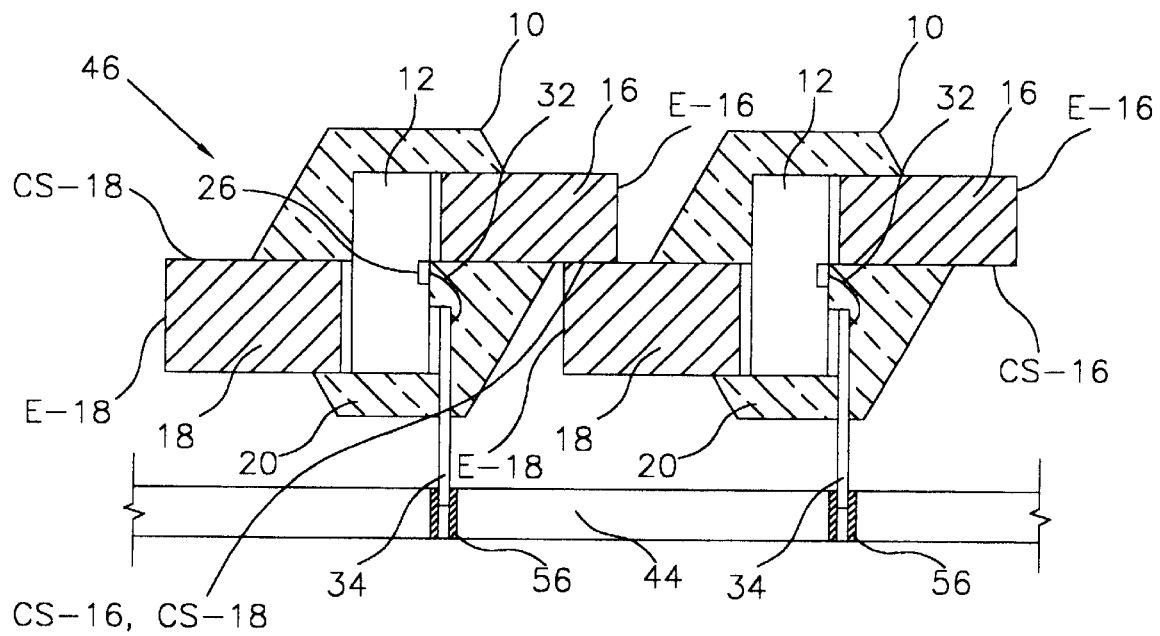
FIG. 2 is an enlarged schematic cross sectional view of an electronic assembly constructed with the package.

The end portions E-16, E-18 also comprise complimentary portions of an interlocking structure. Stated differently, end portion E-16 of heat sink 16 is configured to physically contact and interlock with an end portion of an adjacent package that is substantially similar to end portion E-18 of the package 10. Specifically, as shown in FIG. 2, in an electronic assembly 46 that includes multiple packages 10, the end portions E-16 are configured (i.e., sized, located, oriented, shaped) for interlocking engagement with end portions E-18 on an adjacent package. The interlocking structure maintains the contact surfaces CS-16, CS-18 in physical contact with mating contact surfaces on the adjacent package.

In the package 10 illustrated in FIG. 1B, each heat sink 16, 18 has a thickness T (FIG. 1A) that is approximately equal to one half the width "W" (FIG. 1A) of the die 12. Heat sink 16 substantially covers a first half (i.e., upper half) of the face 22 of the die 12, while heat sink 18 substantially covers a second half (i.e., lower half) of the backside 24 of the die 12. In addition, the heat sinks 16, 18 are located on opposite sides of the second axis 42 (FIG. 1B) of the package 10. This arrangement requires the bond pads 26 on the die 12 to be offset from the center of the die 12 to provide sufficient clearance for the wires 32, and to prevent contact of the heat sinks 16 with the bond pads 26. However, the heat sinks 16, 18 can also be made with different thicknesses or different geometrical configurations to provide mating contact surfaces, along with space for the wires 32 and bond pads 26.

Referring to FIG. 2, the electronic assembly 46 includes a substrate 44 on which the packages 10 are mounted. As an example, the substrate 44 can be a printed circuit board, or a ceramic module, having circuits and metallization patterns formed thereon. In the illustrative embodiment, the terminal leads 34 of the packages 10 are formed in an integral standoff configuration, such that the leads 34 can be soldered to contacts 56 on the substrate 44. The contacts 56 can be metal filled vias or flat pads. Alternately, the terminal leads 34 can be formed in other standard configurations such as J-bend, or butt joint configurations. In addition, rather than solder, electrically conductive adhesives can be used to electrically bond the terminal leads 34 on the packages 10 to the contacts 56 on the substrate 44.

In the assembly 46, due to the orientation of the terminal leads 34, the die 12 is generally orthogonal to a plane of the substrate 44. In addition, the heat sinks 16, 18 are generally parallel to, but spaced from, the plane of the substrate 44. This allows air to flow on either side of the heat sinks 16, 18 and improves heat dissipation from the packages 10.

Also, in the electronic assembly 46, the interlocking of the heat sinks 16, 18 on adjacent packages 10 improves heat dissipation from the packages 10. In particular, the heat sinks 16, 18 can be in thermal communication with an adjacent heat sink which allows heat dissipation therebetween by conduction. In addition, the interlocking heat sinks 16, 18 provide an increased surface area for heat dissipation by convection and radiation.

Figure 3:
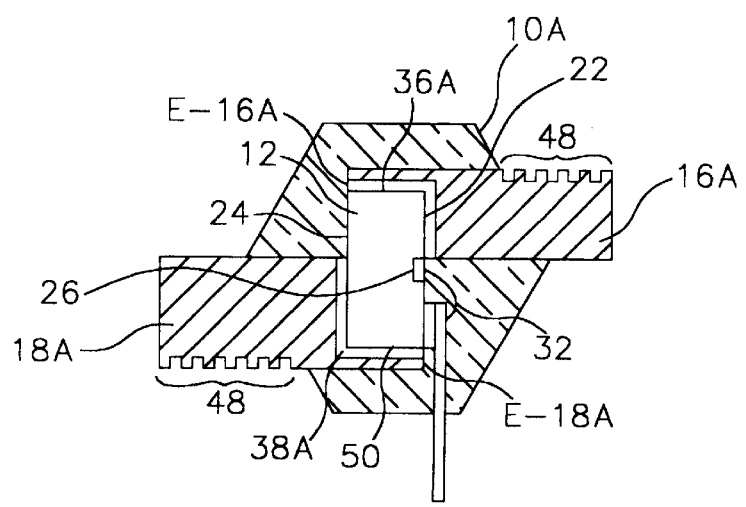
FIG. 3 is an enlarged schematic cross sectional view of an alternate embodiment semiconductor package.

Referring to FIG. 3, an alternate embodiment package 10A includes heat sinks 16A, 18A. The package 10A is constructed substantially as previously described for package 10. However, the heat sinks 16A, 18A have ribbed surfaces 48 to provide an increased surface area for heat dissipation. In addition, the heat sinks 16A, 18A have notched end portions E-16A, E-18A that wrap around the edges 50 of the die 12. Thermally conductive adhesive layer 36A, 38A attach the end portions E-16A, E-18A to the die 12, and allow heat transfer to occur from the edges 50, as well as from the face 22 and backside 24 of the die 12.

Figure 4:
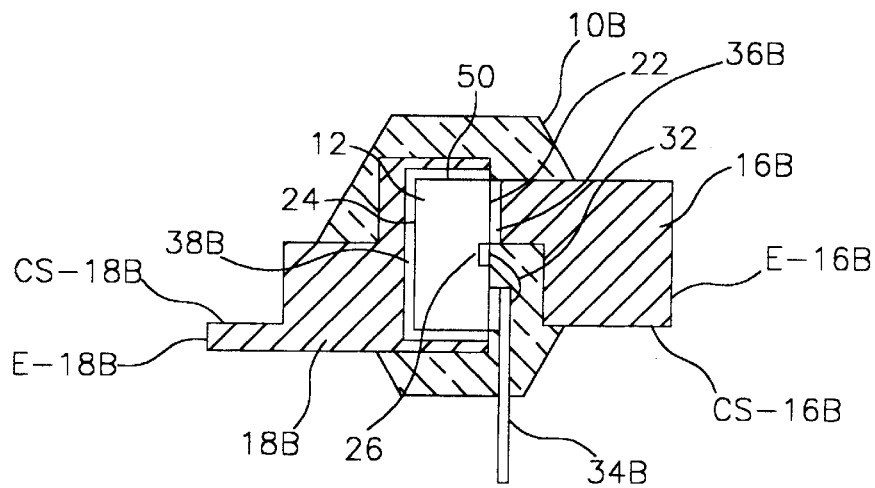
FIG. 4 is an enlarged schematic cross sectional view of another alternate embodiment semiconductor package.

Referring to FIG. 4, an alternate embodiment package 10B includes heat sinks 16B, 18B. The package 10B is constructed substantially as previously described for package 10. However, heat sink 18B is in thermal contact with both the backside 24 and edges 50 of the die 12. A thermally conductive adhesive layer 38B attaches the heat sink 18B to the backside 24 and edges 50 of the die 12. Heat sink 16B is L-shaped and has an enlarged exposed surface area. A thermally conductive adhesive layer 36B attaches the heat sink 16B to the face 22 of the die 12.

Heat sink 18B includes an end portion E-18B having a notched portion that is sized and shaped to interlock with end portion E-16B of heat sink 16B. In addition, end portions E-18B includes a right angle contact surface CS-18B, and end portions E-16B includes a right angle contact surface CS-16B. The contact surfaces CS-16B, CS-18B are configured for physical contact with mating contact surfaces on an adjacent package which is substantially identical to package 10B.

Figure 5:
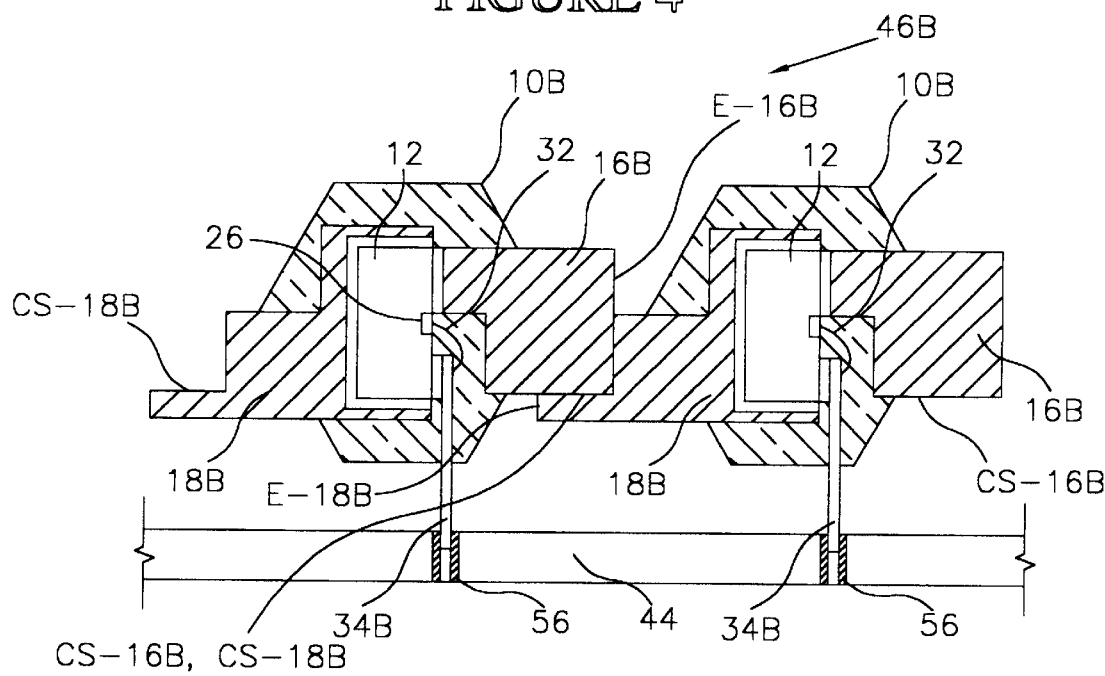
FIG. 5 is an enlarged schematic cross sectional view of an electronic assembly constructed with the semiconductor package of FIG. 4.

FIG. 5 shows an electronic assembly 46B fabricated using the packages 10B. The terminal leads 34B of the packages 10 are attached to contacts 56 on the substrate 44, substantially as previously described, In addition, end portions E-16B, E-18B of adjacent packages interlock to provide increased heat dissipation by conduction convection, and radiation substantially as previously described.

Figure 6:
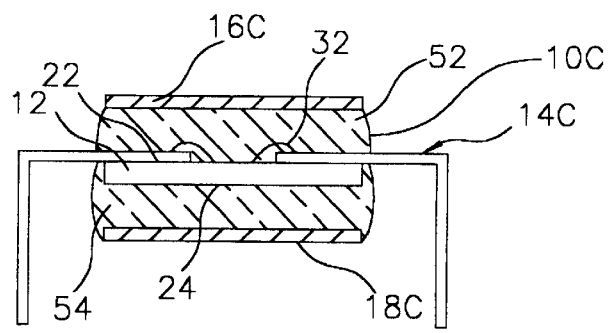
FIG. 6 is an enlarged schematic cross sectional view of an alternate embodiment semiconductor package.

Referring to FIG. 6, an alternate embodiment package 10C is illustrated. The package 10C includes the die 12 and a lead frame 14C. The lead frame 14C forms the signal traces and terminal leads of the package 10C. The package 10C also includes wires 32 wire bonded to the lead frame 14C and to the die 12.

In addition, the package 10C includes a thermally conductive encapsulant 52 which attaches a first heat sink 16C to the face 22 of the die 12. The encapsulant 52 also encapsulates the wires 32 and a portion of the lead frame 14C. A thermally conductive encapsulant 54 attaches a second heat sink 18C to a back side 24 of the die 12, and encapsulates the die 12 and a portion of the lead frame 14C.

The heat sinks 16C, 18C can comprise a high conductivity metal, or a composite as previously described for heat sinks 16, 18. The thermally conductive encapsulants 52, 54 can comprise a thermally conductive polymer, such as a silver filled epoxy paste, a silver filled polyimide paste, or a boron nitride filled polymer paste. Following wire bonding of the die 12 to the lead frame 14C, the encapsulants 52, 54 can be dispensed using a suitable deposition process such as dispensed with a syringe, or with a tool, such as a spatula. Preferably the encapsulants 52, 54 are dispensed in a viscous state and then cured by heating or outgassing of a solvent.

In the package 10C illustrated in FIG. 6, the encapsulants 52, 54 protect the die 12 and form a package body. Alternately, a separate plastic body (not shown) can be formed substantially as previously described for plastic body 20 (FIG. 1B).

In FIG. 7, broad steps in a method for fabricating the semiconductor package 10 of FIGS. 1A–1C are illustrated. The steps include.

1. Providing a semiconductor die 12.
   The die 12 can be a leads on chip die having bond pads 26 located on the face 22, near the center portion of the die 12.
2. Providing a lead frame 14 having lead fingers 28.
   The lead frame 14 can be a leads on chip lead frame having terminal leads 34 in a single in line configuration.
3. Attaching the die 12 to the lead frame 14.
   A die attach adhesive such as an epoxy, acrylic, silicone, or polyimide material can be applied to the die 12, or to the lead frame 14, and cured as required. Alternately, a tape material such as "KAPTON" tape can be employed.
4. Wire bonding the die 12 to the lead frame 14.
   A conventional wire bonder apparatus can be used to wire bond wires 32 to the bond pads 26 on the die 12, and to the lead fingers 28 on the lead frame 14.
5. Attaching heat sinks 16, 18 to the die 12 using a thermally conductive adhesive layer 36.
   Heat sink 16 can be attached to the face 22 of the die 12 and heat sink 18 can be attached to the backside 24 of the die 12. The heat sinks 16, 18 are generally perpendicular or orthogonal to the die 12. In addition, the heat sinks 16, 18 include end portions E-16, E-18 having mating contact surfaces CS-16, CS-18 are configured to interlock adjacent packages in an electronic assembly.
6. Molding plastic body 20 to lead frame 14 to encapsulate die 12 leaving end portions E-16, E-18 of heat sinks 16, 18 exposed.
   The plastic body 20 can have a polygonal cross section configuration such that the heat sinks 16, 18 project from opposed surfaces of the body 20.
7. Trimming lead frame 14 and forming terminal leads 34.
   A conventional trim and form apparatus can be used for trimming the lead frame 14 and forming the terminal leads 34.
8. (Optionally For Fabricating An Electronic Assembly)
   Attaching packages 10 to a substrate 44 with contact surfaces CS-16, CS-18 on end portions E-16, E-18 of heat sinks 16, 18 on adjacent packages in physical contact and thermal communication.

In the electronic assembly 46 of FIG. 2, a space is provided between the heat sinks 16, 18 and substrate 44 to allow air flow therebetween. In addition, the end portions E-16, E-18 of the heat sinks 16, 18 form an interlocking structure such that the contact surfaces CS-16, CS-18 on the end portions E-16, E-18 remain in physical contact and in thermal communication.

Thus the invention provides an improved heat sink semiconductor package, a method for fabricating the package, and improved electronic assemblies fabricated using the package. While the invention has been described with reference to certain preferred embodiments, as will be apparent to those skilled in the art, certain changes and modifications can be made without departing from the scope of the invention as defined by the following claims.

What is claimed is:

1. A semiconductor package comprising:
   a semiconductor die;
   a package body at least partially encapsulating the die;
   a first heat sink in thermal communication with the die and projecting from the body; and
   a second heat sink in thermal communication with the die and projecting from the body, the second heat sink configured to physically engage a heat sink substantially similar to the first heat sink on a second semiconductor package substantially similar to the semiconductor package to provide a thermal path between the semiconductor package and the second semiconductor package.

2. The package of claim 1 wherein the first heat sink, or the second heat sink, comprises a ribbed surface.

3. The package of claim 1 wherein the first heat sink is generally perpendicular to a plane of the die.

4. A semiconductor package comprising:
   a semiconductor die comprising a first side and a second side;
   a plurality of external leads in electrical communication with the die configured for attachment to a substrate;
   a first heat sink attached to the first side comprising a first contact surface;
   a second heat sink attached to the second side comprising a second contact surface;
   the first heat sink and the second heat sink comprising complementary elements configured to maintain the first contact surface or the second contact surface in physical contact with a heat sink on a second package.

5. The package of claim 4 wherein the first contact surface and the second contact surface comprise planar surfaces oriented along a plane generally perpendicular to the die.

6. The package of claim 4 wherein the die comprises an edge and the first heat sink or the second heat sink contacts the edge.

7. The package of claim 4 wherein the first heat sink is generally perpendicular to the first side of the die and the second heat sink is generally perpendicular to the second side of the die.

8. The package of claim 4 wherein the first heat sink is attached to a first half of the die, and the second heat sink is attached to a second half of the die.

9. A semiconductor package comprising:
   a semiconductor die comprising a face and a back side;
   a package body at least partially encapsulating the die;
   a first heat sink in thermal communication with the face and projecting from the body; and
   a second heat sink in thermal communication with the back side and projecting from the body, the second heat sink configured to physically engage a heat sink substantially similar to the first heat sink on a second package substantially similar to the package to provide a thermal path between the second package and the package.

10. The package of claim 9 further comprising a first thermally conductive adhesive layer attaching the first heat sink to the face and a second thermally conductive adhesive layer attaching the second heat sink to the back side.

11. The package of claim 9 wherein the first heat sink includes a first end portion and the second heat sink includes a second end portion, with the first end portion and the second end portion configured as complimentary elements of an interlocking structure.

12. The package of claim 9 wherein the first heat sink has a thickness about one half a width of the die and substantially covers a first half of the face, and the second heat sink has the thickness and substantially covers a second half of the back side.

13. The package of claim 9 wherein the die comprises a first edge and a second edge and the first heat sink substantially covers the first edge and the second heat sink substantially covers the second edge.

14. A semiconductor package comprising:
   a semiconductor die comprising a face, a back side, and a plurality of bond pads on the face;
   a lead frame attached to the face comprising a plurality of lead fingers in electrical communication with the bond pads and forming a plurality of terminal leads;
   a first heat sink attached to the face and a first thermally conductive adhesive layer attaching the first heat sink to the face, the first heat sink oriented generally orthogonally to the face and proximate to a first half of the die; and
   a second heat sink attached to the back side and a second thermally conductive adhesive layer attaching the second heat sink to the back side, the second heat sink oriented generally orthogonally to the back side and proximate to a second half of the die,
   the first heat sink and the second heat sink configured as complimentary elements such that with the terminal leads attached to a substrate the first heat sink or the second heat sink is in thermal communication with a heat sink on a second package on the substrate substantially identical to the package.

15. The package of claim 14 wherein the first thermally conductive adhesive layer and the second thermally conductive adhesive layer comprise a material selected from the group consisting of epoxy and polyimide.

16. The package of claim 14 wherein the first thermally conductive adhesive layer and the second thermally conductive adhesive layer comprise solder.

17. The package of claim 14 wherein the first thermally conductive adhesive layer and the second thermally conductive adhesive layer comprise glass.

18. The package of claim 14 wherein the first heat sink and the second heat sink comprise a metal selected from the group consisting of copper, aluminum, molybdenum, titanium and alloys of these materials.

19. The package of claim 14 wherein the first heat sink and the second heat sink comprise a copper clad composite material.

20. A semiconductor package comprising:
   a semiconductor die comprising a back side, a face, and a plurality of bond pads on the face;
   a lead frame comprising a plurality of lead fingers attached to the face of the die in electrical communication with the bond pads;

a package body at least partially encapsulating the die and at least a portion of the lead frame;

a first heat sink attached to the face generally perpendicular to the face and the lead frame, the first heat sink comprising a first plate projecting from a first surface of the body; and a second heat sink attached to the back side generally perpendicular to the back side and the lead frame, the second heat sink comprising a second plate projecting from a second surface of the body and configured to physically engage a heat sink substantially similar to the first heat sink contained on a second package substantially similar to the package to provide a thermal path between the second package and the package.

21. The package of claim 20 wherein the lead frame comprises a plurality of terminal leads projecting from a third surface of the body.

22. The package of claim 20 wherein the first heat sink or the second heat sink comprise a ribbed structure for increasing a surface area thereof.

23. The package of claim 20 wherein the first heat sink includes a first contact surface and the second heat sink includes a second contact surface.

24. The package of claim 20 wherein the first heat sink includes a first contact surface substantially planar to an axis of the package and the second heat sink includes a second contact surface substantially planar to the axis.

25. The package of claim 20 wherein the lead frame comprises a lead on chip lead frame wire bonded to the die.

26. A semiconductor package comprising:

a semiconductor die comprising a back side, a face, and a plurality of bond pads on the face;

a lead frame comprising a plurality of lead fingers attached to the face;

a plurality of wires bonded to the bond pads and to the lead fingers;

a thermally conductive adhesive encapsulating the face, the back side, the wires and at least a portion of the lead frame;

a first heat sink attached to the face by the thermally conductive adhesive; and a second heat sink attached to the back side by the thermally conductive adhesive, the first heat sink and the second heat sink configured as complimentary elements to provide a thermal path between the package and a second package substantially identical to the package.

27. The package of claim 26 wherein the thermally conductive adhesive comprises a material selected from the group consisting of a silver filled epoxy, a silver filled polyimide and a boron filled polymer.

28. The package of claim 26 wherein the first heat sink is generally parallel to the face and the second heat sink is generally parallel to the back side.

29. An electronic assembly comprising:

a substrate;

a first semiconductor package on the substrate comprising a die, a first heat sink projecting from and in thermal communication with the die, and a second heat sink projecting from and in thermal communication with the die; and a second semiconductor package on the substrate substantially similar to the first semiconductor package and comprising a third heat sink substantially similar to the first heat sink physically contacting the second heat sink on the first semiconductor package to provide a thermal path between the first semiconductor package and the second semiconductor package.

30. The assembly of claim 29 wherein the first heat sink and the second heat sink comprise ribbed surfaces.

31. The assembly of claim 29 wherein the first heat sink includes a first end portion comprising a first planar contact surface and the third heat sink includes a third end portion comprising a third planar contact surface configured for physical contact with the first planar contact surface.

32. An electronic assembly comprising:

a substrate;

a plurality of semiconductor packages on the substrate, each package comprising:

a semiconductor die;

a body at least partially encapsulating the die and having a first side and an opposing second side;

a first heat sink attached to the die and projecting from the first side; and a second heat sink attached to the die and projecting from the second side, the second heat sink configured to physically engage the first heat sink on an adjacent package to provide a thermal path to the adjacent package.

33. The assembly of claim 32 wherein the first heat sink comprises a first planar surface and the second heat sink comprises a second planar surface configured for mating engagement with the first planar surface on the adjacent die.

34. The assembly of claim 32 wherein the first heat sink comprises a first end portion and the second heat sink comprises a second end portion configured to interlock with the first end portion on the adjacent die.

35. The assembly of claim 32 wherein the first heat sink comprises a first plate having a thickness about one half a width of the die and substantially covers a first half of the die, and the second heat sink comprises a second plate having the thickness and substantially covers a second half of the die.

36. A method for fabricating a semiconductor package comprising:

providing a semiconductor die comprising a face and a back side;

providing a first heat sink and a second heat sink comprising complimentary elements configured to provide a thermal path between the package and a second package substantially identical to the package;

attaching the first heat sink to the die in thermal communication with the face;

attaching the second heat sink to the die in thermal communication with the back side; and molding a plastic body to the lead frame to at least partially encapsulate the die leaving at least a first end portion of the first heat sink and a second end portion of the second heat sink exposed.

37. The method of claim 36 wherein attaching the first heat sink to the die comprises forming a thermally conductive adhesive layer between the face and the first heat sink.

38. The method of claim 36 further comprising mounting the package to a substrate and forming the thermal path to the second package.

39. The method of claim 36 wherein the first end portion and the second end portion comprise planar surfaces generally perpendicular to the die.

40. The method of claim 36 wherein the first end portion and the second end portion comprise ribbed surfaces.

41. A method for fabricating a semiconductor package comprising:

providing a semiconductor die comprising a face and a back side;

attaching a first heat sink to the face using a first thermally conductive adhesive layer, the first heat sink oriented generally orthogonally to the face and having a first contact surface;

attaching a second heat sink to the back side using a second thermally conductive adhesive layer, the second heat sink oriented generally orthogonally to the back side and having a second contact surface configured for physical contact with a contact surface of a heat sink substantially similar to the first heat sink contained on a second package substantially similar to the package to provide a thermal path between the second package and the package; and molding a plastic body to the lead frame to at least partially encapsulate the die leaving the first contact surface and the second contact surface exposed.

42. The method of claim 41 wherein the first contact surface and the second contact surface comprise planar surfaces parallel to an axis of the package.

43. The method of claim 41 wherein the first contact surface and the second contact surface comprise complimentary elements of an interlocking structure.

* * * * *